(12) United States Patent
Sota et al.

(10) Patent No.: US 9,537,072 B2
(45) Date of Patent: Jan. 3, 2017

(54) LIGHT EMITTING DEVICE, LEAD FRAME AND RESIN CAVITY MOLDING PACKAGE

(71) Applicant: SHARP KABUSHIKI KAISHA, Osaka (JP)

(72) Inventors: Yoshiki Sota, Osaka (JP); Kazuo Tamaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/085,440

(22) Filed: Mar. 30, 2016

(65) Prior Publication Data

US 2016/0254430 A1 Sep. 1, 2016

Related U.S. Application Data

(62) Division of application No. 14/117,807, filed as application No. PCT/JP2012/003594 on May 31, 2012, now Pat. No. 9,331,254.

(30) Foreign Application Priority Data

Aug. 12, 2011 (JP) .................................. 2011-177324

(51) Int. Cl.
*H01L 27/15* (2006.01)
*H01L 29/267* (2006.01)
(Continued)

(52) U.S. Cl.
CPC .............. *H01L 33/62* (2013.01); *H01L 33/38* (2013.01); *H01L 33/486* (2013.01); *H01L 33/54* (2013.01);
(Continued)

(58) Field of Classification Search
CPC ........... H01L 2924/00; H01L 2924/181; H01L 2924/00014; H01L 2224/32245; H01L 2224/48247; H01L 2224/73265; H01L 2224/97; H01L 2224/48091; H01L 24/97; H01L 33/486; H01L 33/54; H01L 33/62; H01L 33/36; H01L 33/38
(Continued)

(56) References Cited

U.S. PATENT DOCUMENTS 5,083,186 A 1/1992 Okada et al.
5,920,116 A 7/1999 Umehara et al.
(Continued)

FOREIGN PATENT DOCUMENTS

EP 0338298 A2 10/1989
JP 1-251747 A 10/1989
(Continued)

OTHER PUBLICATIONS

Japanese Office Action dated Mar. 17, 2015 issued in counterpart JP Application No. 2011-177324 with a partial English translation.
(Continued)

*Primary Examiner* — Teresa M Arroyo
(74) *Attorney, Agent, or Firm* — Birch, Stewart, Kolasch & Birch, LLP

(57) ABSTRACT

Pkg resin crack is suppressed after dicing.
A light emitting device 1 where a light emitting device 2 that emits light is mounted on a lead frame 3 and that uses a resin cavity molding package 5 having an integrally molded lead frames 3, 4 constituting electrodes that correspond to the light emitting element 2 and resin, wherein roundness is given to a part or all of a cutting plane corner part of a retention section (hanger lead 3a, 4a) that become a cause of crack generation due to the retention sections (hanger leads 3a, 4a) of the lead frames giving stress concentration to resin at the time of cutting by a blade 7.

9 Claims, 6 Drawing Sheets

(51) Int. Cl.

| | | |
|---|---|---|
| *H01L 31/12* | (2006.01) | |
| *H01L 33/00* | (2010.01) | |
| *H01L 29/205* | (2006.01) | |
| *H01L 23/495* | (2006.01) | |
| *H01L 23/48* | (2006.01) | |
| *H01L 23/52* | (2006.01) | |
| *H01L 29/40* | (2006.01) | |
| *H01L 33/62* | (2010.01) | |
| *H01L 33/48* | (2010.01) | |
| *H01L 33/56* | (2010.01) | |
| *H01L 33/54* | (2010.01) | |
| *H01L 33/38* | (2010.01) | |
| *H01L 33/60* | (2010.01) | |
| *H01L 33/36* | (2010.01) | |
| *H01L 23/00* | (2006.01) | |

(52) U.S. Cl.
CPC ............... *H01L 33/56* (2013.01); *H01L 33/60* (2013.01); *H01L 24/97* (2013.01); *H01L 33/36* (2013.01); *H01L 2224/32245* (2013.01); *H01L 2224/48247* (2013.01); *H01L 2224/73265* (2013.01); *H01L 2224/97* (2013.01); *H01L 2924/181* (2013.01); *H01L 2933/0066* (2013.01)

(58) Field of Classification Search
USPC ........... 257/81, 99, 100, 666, 669, 674, 690, 692, 257/773, 775
See application file for complete search history.

(56) References Cited

U.S. PATENT DOCUMENTS

| | | | |
|---|---|---|---|
| 8,525,202 B2 | 9/2013 | Watari et al. | |
| 8,686,464 B2 | 4/2014 | Inoue et al. | |
| 8,772,816 B2 * | 7/2014 | Yoon ..................... | H01L 33/486 257/99 |
| 2007/0262328 A1 | 11/2007 | Bando | |
| 2007/0278511 A1 | 12/2007 | Ohno et al. | |
| 2008/0296604 A1 | 12/2008 | Chou et al. | |
| 2009/0283790 A1 | 11/2009 | Tsou | |
| 2010/0133554 A1 | 6/2010 | Hussell | |
| 2011/0186900 A1 | 8/2011 | Watari et al. | |
| 2011/0210354 A1 | 9/2011 | Ichikawa et al. | |
| 2011/0222299 A1 | 9/2011 | Takahashi et al. | |
| 2012/0300491 A1 * | 11/2012 | Hussell ................. | H01L 33/486 362/602 |

FOREIGN PATENT DOCUMENTS

| | | |
|---|---|---|
| JP | 2-118948 U | 9/1990 |
| JP | 3-293756 A | 12/1991 |
| JP | 7-193179 A | 7/1995 |
| JP | 8-162596 A | 6/1996 |
| JP | 9-153586 A | 6/1997 |
| JP | 10-12643 A | 1/1998 |
| JP | 11-45958 A | 2/1999 |
| JP | 2001-77279 A | 3/2001 |
| JP | 2008-98218 A | 4/2008 |
| JP | 2010-182770 A | 8/2010 |
| TW | I244176 B | 11/2005 |
| TW | 200608537 A | 3/2006 |
| TW | 200847478 A | 12/2008 |
| TW | 201126771 A1 | 8/2011 |

OTHER PUBLICATIONS

Japanese Office Action for Japanese Application No. 2011-177324, dated Jul. 2, 2015, along with a partial English translation thereof.

\* cited by examiner

"PRIOR ART"

"PRIOR ART"

"PRIOR ART"

LIGHT EMITTING DEVICE, LEAD FRAME AND RESIN CAVITY MOLDING PACKAGE

TECHNICAL FIELD

This application is a Divisional of Application No. 14/117,807 filed on Dec. 6, 2013, now U.S. Pat. No. 9,331,254, which was filed as PCT International Application No. PCT/JP2012/003594 on May 31, 2012, which claims the benefit under 35 U.S.C. §119(a) to Patent Application No. 2011-177324 filed in Japan on Aug. 12, 2011, all of which are hereby expressly incorporated by reference into the present application.

The present invention relates to a light emitting device such as an LED device that is integrally molded with lead frames corresponding to each electrode and resin.

BACKGROUND ART

A light emitting device that has integrally molded lead frames corresponding to each electrode and resin is disclosed in Patent Literature 1 as this type of conventional light emitting device.

FIG. 6 is a cross-sectional illustrating an example of a configuration of an essential part of a conventional light emitting device disclosed in Patent Literature 1.

In FIG. 6, a conventional light emitting device 100 is formed such that a cutting plane side surface of a package 101 and cutting planes of lead frames 102 are on the same plane. A side surface in a recess section of the package 101 acts as a reflective wall, and a light emitting element 103 is arranged on the bottom surface of the recess section and is wire-bonded to the lead frames 102 constituting each electrodes of anode/cathode.

CITATION LIST

Patent Literature

Patent Literature 1: Japanese Laid-Open Publication No. 2007-329219

SUMMARY OF INVENTION

Technical Problem

As in the above-described conventional configuration, a light emitting device that is integrally molded with lead frames 102 corresponding to each electrode and resin has a configuration in which the cutting plane of the lead frames 102 match the cutting plane side surface of the package 101 made of resin material. However, crack generation in the package 101 due to the lead frames 102 at the cutting plane in a dividing step of a light emitting device and the shape of the cutting planes of the lead frames 102 for suppressing crack generation, which are the problem to be solved of the present application, are not described at all. On the other hand, in the above-described light emitting device, there are those employing a lead frame configuration having a retention section (also referred to as hanger lead or suspension lead) for connecting and retaining a plurality of lead frames that are to be LED chip mounting surfaces of a light emitting device, which are formed by being cut and singulated at the part of the retention section together with the package made of resin material to be on the same plane.

FIG. 7 is a view of a cutting plane side surface of a light emitting device illustrating a case where the shape of the cutting plane of a hanger lead is quadrangular in a conventional light emitting device having such a lead frame configuration. The hanger lead extends completely through from the LED chip mounting surface section of the lead frame to the side surface of the package made of resin material, and is formed such that the side surface of the package and the cutting plane of the hanger lead are on the same plane. When thermosetting resin is used as resin material for the package of such a light emitting device, since many do not have mechanical strength, as illustrated in FIG. 8, cracks 203 occur at the time of dicing with cut positions of two corner sections on the bottom side among the four corner sections of the quadrangular cross section of the hanger lead 202 of each lead frame as the origin.

The present invention is intended to solve the conventional problems described above. It is an objective of the present invention to provide a light emitting device capable of suppressing cracks generated on a package made of resin material after dicing and lead frames for constituting the light emitting device.

Solution to Problem

A light emitting device according to the present invention where one or a plurality of light emitting elements that emit light are mounted and that uses a resin cavity molding package having integrally molded lead frames constituting an electrode that corresponds to the one or plurality of light emitting elements and resin is provided, where roundness is given to a part or all of cutting plane corner parts of a retention section of the lead frames, thereby achieving an objective described above.

Preferably, in a light emitting device according to the present invention, roundness for crack prevention is given to one or two corner parts that is a cause of crack generation at a time of cutting among four corner parts of a quadrangular cutting plane in the retention section of the lead frames.

Still preferably, in a light emitting device according to the present invention, roundness is given to one or two corner parts on a device installation surface side or device back surface side among four corner parts of a quadrangular cutting plane in the retention section of the lead frames that is exposed on a cutting plane side of the package.

Still preferably, in a light emitting device according to the present invention, roundness is given to at least one of two corner parts opposing a thinner side of the resin among four corners part of a quadrangular cutting plane in the retention section of the lead frames that is exposed on a cutting plane side surface of the package.

Still preferably, in a light emitting device according to claim 1, wherein roundness is given to one or two corner parts on a side where cutting load by a cutting blade to the resin at a time of cutting is exerted.

Still preferably, in a light emitting device according to the present invention, roundness is given to all four corners or the entire circumference of a quadrangular cutting plane in the retention section of the lead frames that is exposed on a cutting plane side surface of the package.

Still preferably, in a light emitting device according to the present invention, the rounding is formed by rounding processing or chamfer processing.

Still preferably, in a light emitting device according to the present invention, a cutting plane of the resin and a cutting plane of the retention section of the lead frames are on a same plane.

Still preferably, in a light emitting device according to the present invention, the resin is thermosetting resin.

Still preferably, in a light emitting device according to the present invention, a recess section is formed to open upward on the resin cavity molding package, and the one or plurality of light emitting elements are mounted on the lead frame in the recess section and side walls in the recess section are formed to taper open towards outside as a reflective wall.

The functions of the present invention having the structures described above will be described hereinafter.

In the present invention, in a light emitting device using a resin cavity molding package that is integrally molded with lead frames constituting electrodes of the light emitting element and resin, a part or all of the cross section corner parts of a retention section which becomes a cause of crack generation from stress concentration given to resin by the retention section of the lead frames at the time of cutting is given roundness.

Since a part or all of the cross section corner part of the retention section of the lead frames is given roundness thereby, stress concentration to the resin from the retention section of the lead frames that occurs at the time of cutting is lessened, and resin cracks at the retention section of the lead frames after dicing can be suppressed.

Advantageous Effects of Invention

According to the present invention described above, since a part or all of the cross section corner parts of the retention section of the lead frames is given roundness, stress concentration to the package made of resin material from the retention section of the lead frames that occurs at the time of cutting is lessened, and generation of a resin crack at the package made of resin material after dicing can be suppressed.

Figure 1:
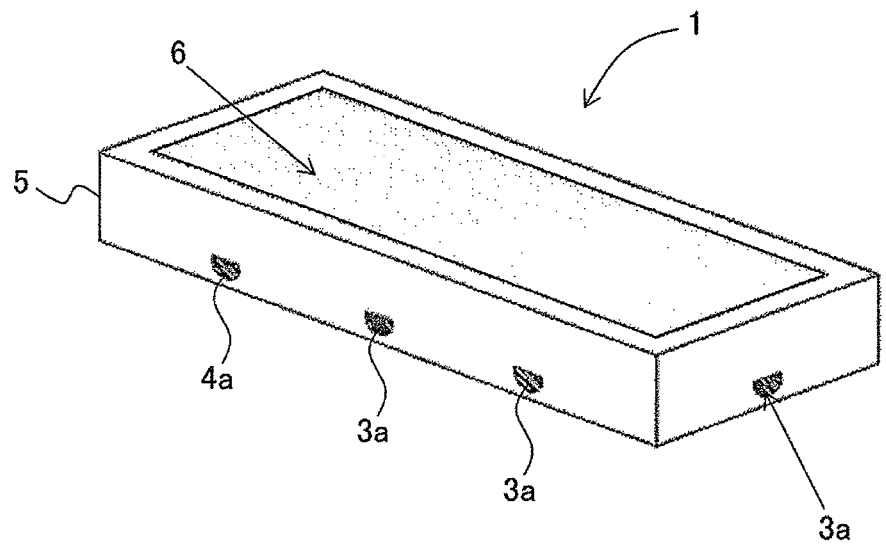
FIG. 1 is a perspective view schematically illustrating an example of a configuration of an external view of a light emitting device in Embodiment 1 of the present invention.

REFERENCE SIGNS LIST 1 light emitting device
2 optical element
2a wire
3, 4 lead frame
3a, 4a hander lead
5 white resin cavity molding package
5a side surface constituting a reflection wall in a recess section
5b position of surfaces of lead frames and mounting surface of a light emitting element
6 inner resin (sealing resin)
7 blade (rotating cutting blade)
8 plate body
R rounding processing radius
C chamfer section

DESCRIPTION OF EMBODIMENTS

Hereinafter, Embodiment 1 of a light emitting device and a production method thereof of the present invention will be described in detail with reference to the accompanying figures. With respect to the prepared figures, thicknesses, lengths or the like of each element in each figure are not limited to the configuration shown in the figure.

(Embodiment 1)

Figure 2:
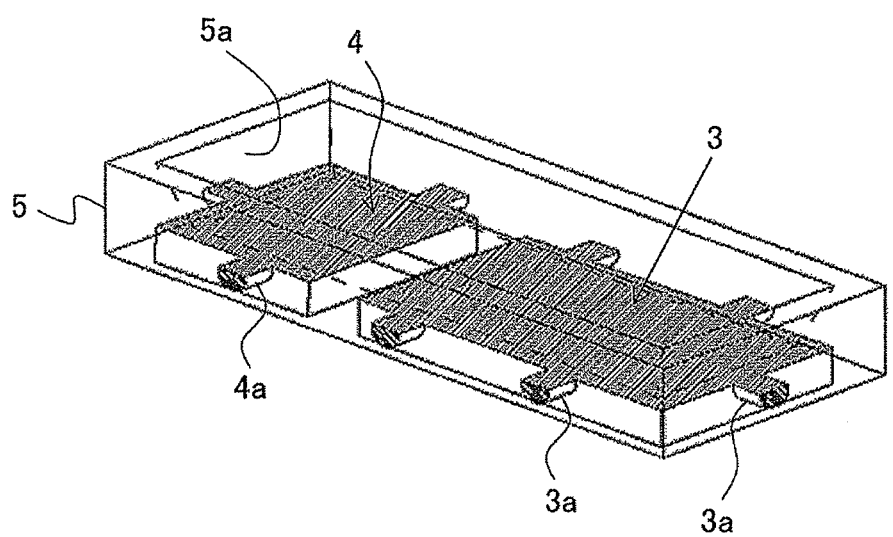
FIG. 2 is a perspective view of lead frames illustrating a state prior to mounting a light emitting element such as an LED element in the light emitting device of FIG. 1.
Figure 3:
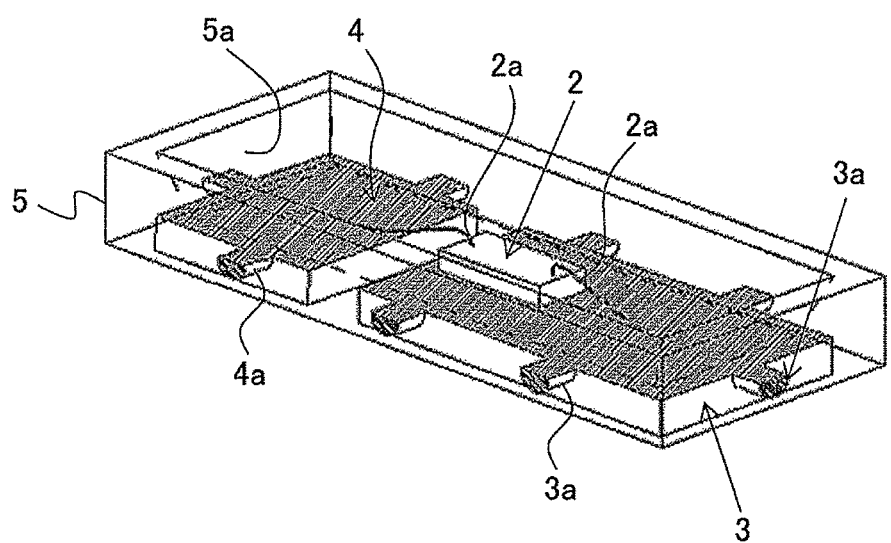
FIG. 3 is a perspective view of lead frames and a light emitting element illustrating a state of being mounted with a light emitting element such as an LED element on the lead frame in the light emitting device of FIG. 1.
Figure 4:
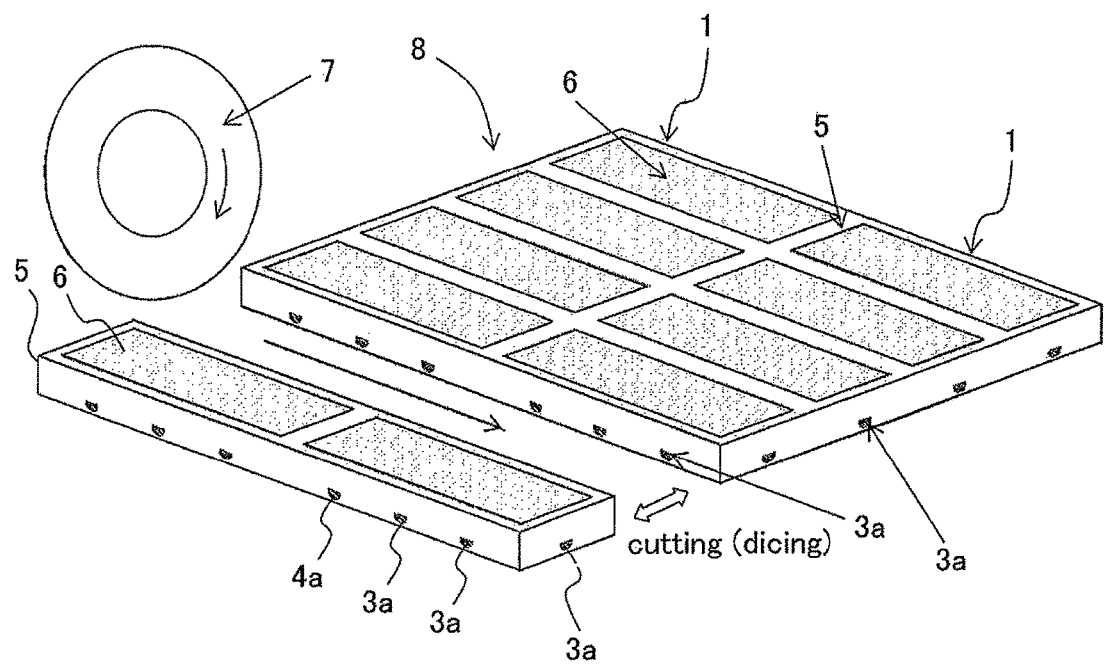
FIG. 4 is a cutting image view of singulation for obtaining the light emitting device of FIG. 1.

FIG. 1 is a perspective view schematically illustrating an example of a configuration of an external view of a light emitting device in Embodiment 1 of the present invention. FIG. 2 is a perspective view of lead frames illustrating a state prior to mounting a light emitting element such as an LED element in the light emitting device of FIG. 1. FIG. 3 is a perspective view of lead frames and a light emitting element illustrating a state of being mounted with the light emitting element such as an LED element on the lead frame in the light emitting device of FIG. 1. FIG. 4 is a cutting image view of singulation for obtaining the light emitting device of FIG. 1.

In FIGS. 1 to 3, a light emitting device 1 such as an LED device of Embodiment 1 has an optical element 2 such as an LED element for emitting light, a metallic lead frame 3 that constitutes one of the electrodes and Where the optical element 2 is arranged, a metallic lead frame 4 that constitutes the other electrode, and a white resin cavity molding package 5 using white resin integrally molded with a pair of these lead frames 3, 4.

For white resin, thermosetting resin of silicone based (as resin material other than silicone based material (hard and brittle), epoxy, PPA (polyphthalamide), or the like may be used) resin material added with light diffusion material such as titanium oxide is used. On the package 5, a recess section having side walls in the perimeter is formed to open upwards. In the recess section, side surfaces 5a of a reflective wall are formed to taper open towards the outside in four directions.

The light emitting device 1 is mounted with the light emitting element 2, and has a pair of lead frames 3, 4 constituting each electrode that is wire-bonded to a terminal of the light emitting element 2 by a wire 2a. A plurality of these pairs are arranged in a matrix pattern, and a retention section is provided for linking between each adjacent lead frames 3, 3 and adjacent lead frames 4, 4. The retention section is generally called "suspension". The retention section between adjacent lead frames will be called hanger leads (also referred to as suspension lead).

The production method of the light emitting device 1 of Embodiment 1 will be explained.

Initially, in a white resin cavity molding step of FIG. 2, a plurality of pairs having the lead frames 3, 4 as a pair are arranged in the column and row directions in a matrix pattern, and lead frames adjacent in the column and row directions are linked by hanger leads 3d or 4d with one another. The package 5 made of white resin is integrally molded with a plurality of pairs of such lead frames 3, 4. A recess section is formed to open upward on a package 5 constituted of integrally molded white resin. A side surface 5a in this recess section is formed to taper open towards the outside.

Next, in an optical element mounting step of FIG. 3, an optical element 2 is mounted at the central portion of the bottom surface in the recess section of the package 5 constituted of integrally molded white resin. In short, the optical element 2 is fixed and mounted in a predetermined position on the lead frame 3 which is exposed in the recess section of the package 5 with an adhesive or the like. The optical element 2 is wire-bonded to each of the lead frames 3, 4.

Next, in an inner resin tilling step of FIG. 1, the inside of the recess section of the package 5 constituted of white resin is filled in with sealing inner resin 6 along with the optical element 2. Light scattering material, fluorescent material, and the like is mixed into the sealing inner resin 6 (also referred to as sealing resin). For example, if the optical element 2 is a blue LED, the optical element can be configured to output white light with blue light by mixing in fluorescent material emitting red and green lights in the inner resin 6.

After that, in a singulation step of FIG. 4, a plate body 8 is cut in a lattice pattern between each light emitting device 1 to singulate into each light emitting device 1 by a blade 7 (rotating cutting blade) while a cutting tape is pasted onto the back surface of the plate body 8 on which a plurality of light emitting devices 1 are formed in a matrix pattern. In this case, cutting planes of the hanger leads 3a, 4a of the lead frames 3, 4 match the cutting plane side surface of the package 5 made of white resin (Pkg resin). Further, each light emitting device 1 that is cut using a cutting tape that is not shown in the drawings does not come apart. The cutting tape is removed in the final step.

Here, each cross-sectional shape, which is the feature configuration of the present invention, upon cutting the hanger lead 3a of the lead frame 3 where the optical element 2 is mounted and that constitutes one of the electrodes and the hanger lead 4a of the lead frame 4 constituting the other electrode will be explained using FIGS. 5A to 5E.

Corner parts where the hanger leads 3a, 4a as each retention section of the lead frames 3, 4 gives stress concentration to white resin (Pkg resin) to become a cause of crack generation are removed and given roundness. When the direction of the rotation of the blade 7 is in a clockwise direction, rotational force is exerted on the white resin downward. However, when the direction of the rotation of the blade 7 is in a counter-clockwise direction, rotational force is exerted on the white resin upward. Generally, cutting is more stable when the direction of the rotation of the blade 7 is in a clockwise direction.

Figure 5A:
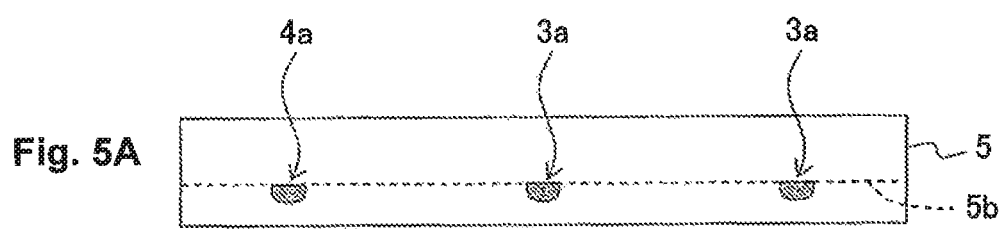
FIG. 5A is a view of a cutting plane side surface illustrating a case where the bottom two corner parts among the four corner parts of a quadrangular shape of a cutting plane of the hanger leads of the light emitting device of FIG. 1 are given roundness.
Figure 5B:
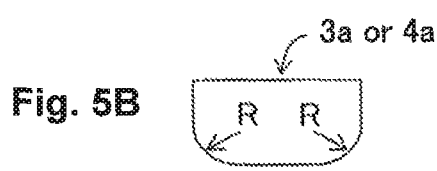
FIG. 5B is an expanded view of the shape of the cutting plane of the hanger leads of FIG. 5A.
Figure 5D:
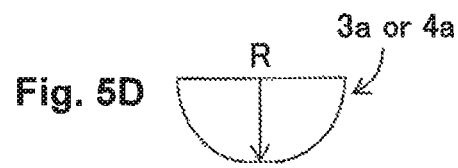
FIG. 5D is a cutting plane view of a hanger lead illustrating a case where the shape of the cutting plane of the hanger lead has a semi-circular or semi-elliptical shape.
Figure 5C:
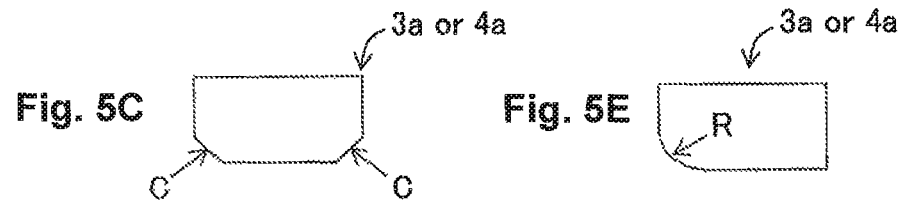
FIG. 5C is a cutting plane view of a hanger lead illustrating a case where chamfer processing instead of rounding processing of FIG. 5B is applied to the two corner parts.
Figure 5E:
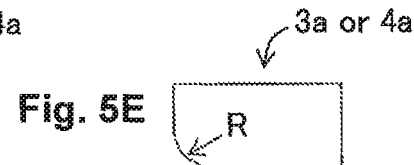
FIG. 5E is a cutting plane view illustrating a case where only one corner part on the bottom side among four corner parts of the shape of the cutting plane of the hanger lead of FIG. 5A is given roundness.
Figure 6:
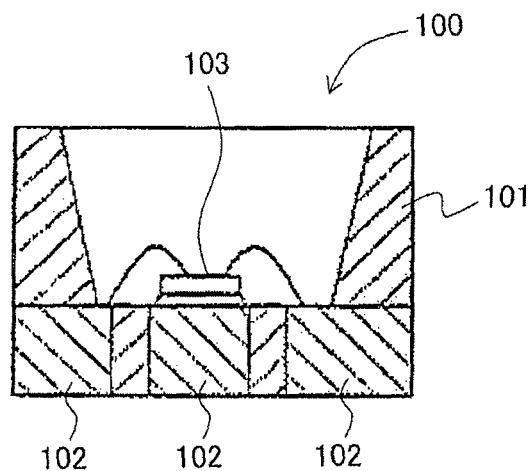
FIG. 6 is a cross-sectional view illustrating an example of a configuration of an essential part of a conventional light emitting device disclosed in Patent Literature 1.
Figure 7:
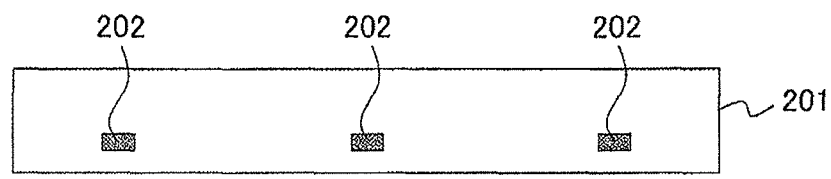
FIG. 7 is a view of a cutting plane side surface illustrating a case where the shape of the cutting plane of a hanger lead of a conventional light emitting device of a product is quadrangular.
Figure 8:
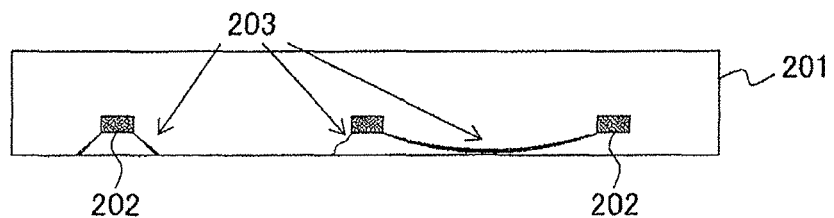
FIG. 8 is a view of a cutting plane side surface illustrating a state of cracks being generated from hanger leads of the conventional light emitting device of FIG. 7 at the time of cutting.

FIG. 5A is a cutting plane side surface illustrating a case where the bottom two corner parts among the four corner parts of a quadrangular shape of a cutting plane of the hanger leads 3a, 4a of the light emitting device 1 of FIG. 1 are given roundness. FIG. 5B is an expanded view of the shape of the cutting plane of the hanger leads 3a, 4a of FIG. 5A. FIG. 5C is a cutting plane view of a hanger lead illustrating a case where chamfer C processing instead of rounding R processing of FIG. 5B is applied to the bottom two corner parts. FIG. 5D is a cutting plane view of a hanger lead illustrating a case where the shape of the cutting plane of the hanger lead has a semi-circular or semi-elliptical shape. FIG. 5E is a cutting plane view illustrating a case where only one corner part on the bottom side among four corner parts of the shape of the cutting plane of the hanger lead of FIG. 5A is given roundness.

As illustrated in FIGS. 5A and 5B, roundness (referred to as rounding processing section (R processing section)) for crack prevention at the time of cutting is given to the two corner parts on the back surface side of the light emitting device 1 or the installation surface side (bottom side) of the light emitting device among the four corner parts of a quadrangular shape that is a square or rectangular cross-section of the hanger leads 3a, 4a. In short, a curved surface section of a cutting plane of the lead hangers 3a, 4a that is given roundness is provided, on the side surface of the package 5 (cutting plane), on the side with thinner thickness of white resin in comparison to the thickness of white resin around the hanger leads 3a, 4a, the thickness of the white resin (Pkg resin) being from the position of the cutting plane of the hanger leads 3a, 4a to the position of the installation surface (bottom side) of the light emitting device 1, or is formed to give roundness (referred to as rounding processing section (R processing section) to two corner parts on the side (bottom side) on which a cutting load due to the blade to the white resin package 5 at the time of cutting is exerted on the white resin. Since it is sufficient to suppress cracks at the time of cutting, all four corner parts or the entire circumference of a quadrangular shape that is a square or rectangular cross-section of the hanger leads 3a, 4a can be a curved surface (for example, circular or elliptical cross section). For example, as illustrated in FIG. 5D, the shape of the cutting plane of the hanger leads 3a, 4a can be a semi-circle or a semi-elliptical.

Further, a lead frame main body of the lead frames 3, 4 (except the curved surface section of suspension lead) can be formed by not only etching using an acidic or alkaline solution (hereinafter, etching that reduces the thickness of a lead frame substrate to about half will be referred to as half-etching), but also by press molding.

An example of formation will be explained below.

On the back surface of a metal plate substrate (surface on the back side that is to be an installation surface of the light emitting device, opposite side back surface of the mounting surface (light emitting surface side) of the light emitting element 2 (for example, LED chip)), which is the basis of the frame main body of the lead frames 3, 4, a mask is formed on the part to be an installation surface of the light emitting device 1 and the periphery thereof is half-etched. Next, on the front surface of the metal plate substrate (surface of the mounting surface side of an LED chip), a mask is formed on parts corresponding to the hanger leads 3a, 4a and mounting surface section of the LED chip, and wire-bonding section, and the surrounding parts thereof are half-etched. At this time, a mask is formed on the entire surface on the back surface side of the metal plate substrate so as not to be etched.

In this step, the section between the lead frames 3, 4 of the metallic plate substrate is etched for the whole thickness, which secures electrical insulation between the lead frames 3, 4. Further, the lead frames 3, 4 are retained by the hanger leads 3a, 4a between other pairs of the lead frames 3, 4.

Further, in mask formation on the surface of the metallic plate substrate, it can be such that a mask of a part corresponding to the recess section to be an anchor section is not formed in order to improve adhesion with the above-mentioned white resin and/or inner resin. The same applies to a half-etching step of the back surface side of the metal plate substrate.

Further, half-etching can be performed in the order of front surface side and back surface side, or the front and back can be performed simultaneously.

Commonly used, well-known material, such as resist, is used as mask material.

After the above-described lead frame formation step, in order to make the cross-sectional shape of the hanger leads 3a, 4a to have a desired curved surface shape (for example, rounding processing illustrated in FIG. 5B), after removing the mask, soft-etching (processing with an acidic or alkaline solution or the like in a short period of time) is performed. Besides this, as illustrated in FIG. 5C, chamfer processing (also referred to as C processing) can be performed on the two corner parts on the bottom side of the four corner parts to remove the corner parts, instead of the rounding processing of FIG. 5B.

Furthermore, as illustrated in FIG. 5E, roundness (rounding processing or chamfer processing) for crack prevention at the time of cutting can be given to one corner part on either left or right on the back surface side (bottom side) of the light emitting device 1 among the four corner parts of a quadrangular shape that is a square or rectangular cross-section of the hanger leads 3a, 4a. In short, when cut into each light emitting device 1 by a blade, roundness (rounding processing or chamfer processing) for crack prevention at the time of cutting is given to one corner part on either left or right on the side where the hanger leads 3a, 4a are initially cut to disperse stress concentration.

When the cross-sectional dimension of the hanger leads 3a, 4a of the lead frames 3, 4 is made to be, for example, a cross sectional rectangle with a long side (width) of 150 μm×short side (thickness) of 120 μm, the radius (r) of the curved surface section given roundness (rounding processing or chamfer processing (chamfer part C)) of the cutting plane of the hanger leads 3a, 4a is to be r=30 to 90 μm (or 40 to 60 μm). If the radius (r) becomes less than 30 μm, the effect of dispersing stress concentration is greatly reduced. From the viewpoint of consistency in production steps, it is preferable that the radius (r) is a value of 60 μm, which is half of the short side (length) of 120 μm. The radius (r) is equal to R that indicates a rounding processing radius in FIGS. 5B, 5D, and 5E. Further, the dotted line illustrated in FIG. 5A is the positions 5b of the surface of the lead frames 3, 4 and the rounding surface of the light emitting element 2 which indicates the position of the bottom surface of the recess section.

In short, as mentioned above, roundness is given to a part or all of the cross sectional corner parts of the retention sections (hanger leads 3a, 4a) which becomes a cause of crack generation from stress concentration given to white resin by the retention sections (hanger leads 3a, 4a) of the lead frames 3, 4 at the time of cutting.

Specifically, for example, roundness for crack prevention can be given to one or two corner parts which becomes a cause of crack generation at the time of cutting among four corner parts of a quadrangular cutting plane in the retention sections (hanger leads 3a, 4a) of the lead frames 3, 4. Further, roundness can be given to one or two corner parts on the device installation surface side or the device back surface side among the four corner parts of a quadrangular cutting plane in the retention sections (hanger leads 3a, 4a) of the lead frames 3, 4 that are exposed on the cutting plane side surface of the package 5. Furthermore, roundness can be give to at least one of two corner parts that oppose the thinner side of white resin among the four corner parts of the quadrangular cutting plane in the retention sections (hanger leads 3a, 4a) of the lead frames 3, 4 that are exposed on the cutting plane side surface of the package 5. Furthermore, roundness can be given to one or two corner parts on the side on which a cutting load by the cutting blade to the white resin of the package 5 at the time of cutting is exerted. Moreover, roundness can be given to all four corner parts or the entire circumference of the quadrangular cutting plane in the retention sections (hanger leads 3a, 4a) of the lead frames that are exposed on the cutting side surface of the package 5. Furthermore, rounding can be formed by rounding processing or chamfer processing.

In the above-described Embodiment 1, cross section rounding of the retention sections (hanger leads 3a, 4a), which is the feature configuration of the present application, is applied to the light emitting device 1 using the package 5 where one light emitting element 2 that emits light is mounted and that is constituted of lead frames 3, 4 constituting electrodes corresponding to the one light emitting element 2 and white resin, but is not limited to this. Cross section rounding of the retention sections (hanger leads 3a, 4a), which is the feature configuration of the present application, can be applied to a light emitting device using a package where a plurality (for example, two or three) of light emitting elements that emit light are mounted and that is constituted of lead frames constituting electrodes corresponding to the plurality of light emitting element and white resin.

From the above, in a light emitting device where a hanger lead cutting plane and a light emitting device dividing (cut) surface are on a same plane, by the crack suppression effect due to the above-described hanger lead configuration, thermosetting resin that possesses excellent weather resistance and light resistance, but is hard and brittle, can be used as Pkg resin with stability.

In other words, from the configuration of the invention of the present application (hanger lead configuration), since load to Pkg resin due to lead frames can be reduced, and further thermosetting resin that possesses excellent weather resistance and light resistance can be used as Pkg resin, reliability as a light emitting device can be improved. Further, a light emitting device configuration where a cutting plane of a hanger lead and a light emitting device dividing (cut) surface are on a same plane can be employed. Thus, an outer lead configuration in which the exterior of Pkg resin protrudes out is not employed. Thereby, a light emitting device can be made small and the number of pkg that can be arranged on a lead frame can be increased, which have cost lowering effects.

As described above, the present invention is exemplified by the use of its preferred Embodiment 1. However, the present invention should not be interpreted solely based on Embodiments 1 described above. It is understood that the scope of the present invention should be interpreted solely based on the claims. It is also understood that those skilled in the art can implement an equivalent scope of technology, based on the description of the present invention and common knowledge from the detailed description of the preferred Embodiments 1 and 2 of the present invention. Furthermore, it is understood that any patent, any patent application, and any references cited in the present specification should be incorporated by reference in the present specification in the same manner as the contents are specifically described therein.

INDUSTRIAL APPLICABILITY

The present invention can be applied in the field of a light emitting device such as an LED device that is integrally molded with lead frames corresponding to each electrode and resin. According to the present invention described above, since a part or all of the cross section corner parts of retention sections of lead frames is given roundness, stress concentration to resin material from the retention sections of the lead frames that occurs at the time of cutting is lessened, and white resin cracks after dicing can be suppressed.

The invention claimed is:

1. A light emitting device comprising:
a resin cavity molding package having resin and integrally molded lead frames each constituting an electrode,
wherein at least one of the lead frames has a retention section extending from said at least one of the lead frames towards an outer surface of the resin cavity molding package,
wherein a periphery of the retention section is surrounded by the resin,
wherein the retention section has a cut and exposed plane that is coplanar with the outer surface of the resin cavity molding package,
wherein a part or all of cut and exposed plane corner parts of the retention section of the lead frames is rounded off; and
one or a plurality of light emitting elements that emit light mounted in the resin cavity molding package,
wherein each light emitting element is mounted on a first lead frame that constitutes a first electrode, and conductively connected to a second electrode.

2. A light emitting device according to claim 1,
wherein the cut and exposed plane of the retention section is quadrangular and has four corner parts,
wherein one or two among the four corner parts that are a cause of crack generation at a time of cutting are rounded to prevent cracking.

3. A light emitting device according to claim 1,
wherein the cut and exposed plane of the retention section is quadrangular and has four corner parts,
wherein one or two among the four corner parts on a device installation surface side or device back surface side are rounded.

4. A light emitting device according to claim 1,
wherein the cut and exposed plane of the retention section is quadrangular and has four corner parts,
wherein at least one of two corner parts, which are among the four corner parts and oppose a thinner side of the resin, are rounded.

5. A light emitting device according to claim 1,
wherein the cut and exposed plane of the retention section has a plurality of corner parts,
wherein one or two corner parts of the plurality of corner parts, on a side where cutting load by a cutting blade to the resin at a time of cutting is exerted, are rounded.

6. A light emitting device according to claim 1,
wherein the cut and exposed plane of the retention section is quadrangular and has four corner parts,
wherein all four corners or the entire circumference of the quadrangular cutting plane are rounded.

7. A light emitting device according to claim 1, wherein the rounded shape is formed by rounding processing or chamfer processing.

8. A light emitting device according to claim 1, wherein the resin is thermosetting resin.

9. A light emitting device according to claim 1, wherein a recess section is formed to open upward on the resin cavity molding package, and each light emitting element is mounted on a lead frame in the recess section and side walls in the recess section are formed to taper open towards outside of the resin cavity molding package as a reflective wall.

* * * * *